United States Patent [19]
Satwinder

[11] Patent Number: 5,936,840
[45] Date of Patent: Aug. 10, 1999

[54] STACKED PASSIVE COMPONENTS

[75] Inventor: Malhi Satwinder, Garland, Tex.

[73] Assignee: Texas Instruments Incorporated, Dallas, Tex.

[21] Appl. No.: 08/963,142

[22] Filed: Nov. 3, 1997

[51] Int. Cl.⁶ ................................................. H05K 7/02
[52] U.S. Cl. .................. 361/728; 361/742; 361/735; 361/807; 361/738; 361/744; 361/743; 257/686; 257/678; 257/723
[58] Field of Search ................................. 361/728, 736, 361/738, 742, 744, 748, 760, 763, 765, 766, 729, 735, 807; 257/686, 678, 723

[56] References Cited

U.S. PATENT DOCUMENTS

| | | | |
|---|---|---|---|
| 5,019,943 | 5/1991 | Fassbender et al. | 361/744 |
| 5,347,428 | 9/1994 | Carson et al. | 361/760 |
| 5,446,620 | 8/1995 | Burns et al. | 361/704 |
| 5,502,667 | 3/1996 | Bertin et al. | 365/51 |
| 5,754,405 | 5/1998 | Derouiche | 361/744 |

*Primary Examiner*—Leo P. Picard
*Assistant Examiner*—David Foster
*Attorney, Agent, or Firm*—Warren L. Franz; Wade James Brady, III; Richard L. Donaldson

[57] ABSTRACT

The invention is component module (20) for combining a plurality of components (21, 23, 25, 27 and 29) into a single module (20) for use with a printed wiring board. A plurality of components, each component having a pair of contacts (21a, 21b), are formed into the module with a plurality of insulating spacers (2, 24, 26 and 28). There is one spacer between adjacent components, said spacers serving to insulate adjacent components from each other and to secure the components together to form the module.

9 Claims, 5 Drawing Sheets

STACKED PASSIVE COMPONENTS

FIELD OF THE INVENTION

The invention relates to printed wiring boards with passive and active components thereon, and more particularly to a stacked array of passive components for mounting on a printed wiring board to reduce the space required for such passive components when mounted on the printed wiring board.

BACKGROUND OF THE INVENTION

Printed wiring boards, to meet requirements of small systems such as hand-held electronic devices and portable computing systems, have been made smaller with the components mounted thereon occupying a large amount of the surface along with the printed interconnecting conductors. The large number of components used requires assembly time and often parasitic interaction between components occurs because of the distance between various components. Greater component density within integrated circuits has solved some of the problems, however, there remains the problem of passive components occupying a great amount of space.

SUMMARY OF THE INVENTION

The invention is a component module for combining a plurality of components into a single module for use with a printed wiring board. A plurality of components, each component having a pair of contacts, are formed into the module with a plurality of insulating spacers. There is one spacer between adjacent components, said spacers serving to insulate adjacent components from each other and to secure the components together to form the module.

The technical advance represented by the invention, as well as the objects thereof, will become apparent from the following description of preferred embodiments of the invention, when considered in conjunction with the accompanying drawings and the novel features set forth in the appended claims.

DESCRIPTION OF PREFERRED EMBODIMENTS

Figure 1:
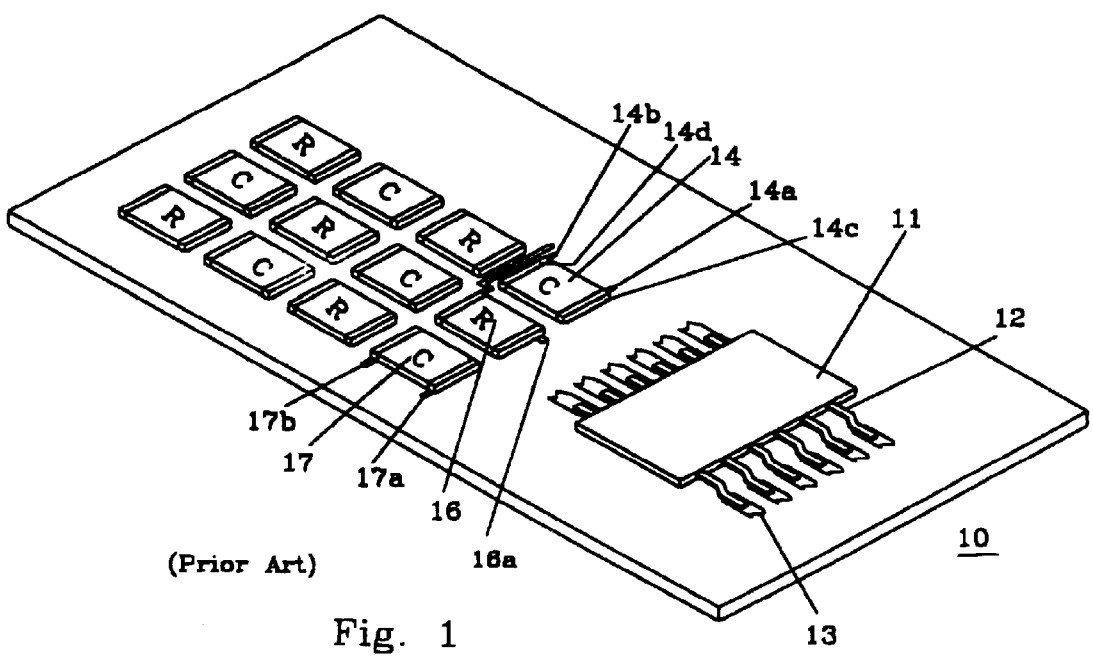
FIG. 1 shows a prior art printed wiring board with a plurality of passive components and an integrated circuit.

FIG. 1 shows a prior art printed wiring board 10 having a semiconductor device 11 mounted thereon by leads 12 connected to printed wiring conductors 13. An array of various devices such as resistor 16 and capacitor 14 are connected to various printed wiring conductors including 14a and 14b connected to capacitor 14, and conductors 17a and 17b connected to capacitor 17. Resistor 16 is connected to conductors 16a and 16b. Each component, for example capacitor 14, has one of contacts 14c and 14d on each end. Similarly, each of the other components has two contacts, one on each end of the component. It is these contacts that are connected to conductors on printed wiring board 10. To interconnect the various resistors and capacitors an array of printed wiring conductors must be formed around the surface of printed wiring board 10, and if printed wiring board 10 is a multilayer board, conductors may be on each side of multiple layers. Various other components, such as inductors and single element semiconductor devices, including diodes (not illustrated), may be interconnected on printed wiring board 10.

Figure 2:
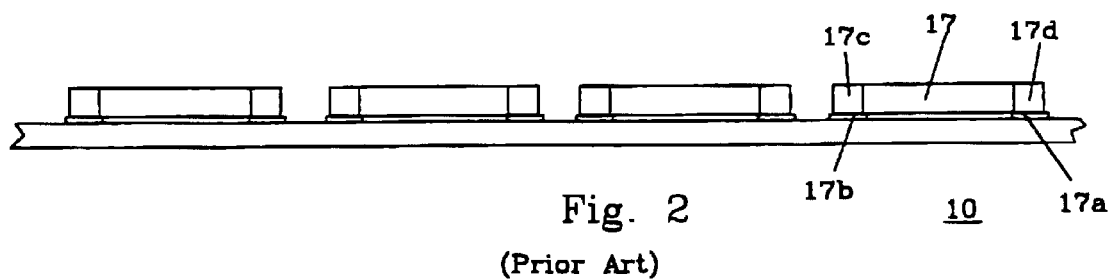
FIG. 2 is a side view of the passive components mounted on a printed wiring board.

FIG. 2 is a partial side view of the printed wiring board 10 of FIG. 1 showing the edges of the components mounted thereon. Capacitor 17 is electrically connected to the conductors 17a and 17b via the contacts 17c and 17d on the ends of capacitor 17.

Figure 3:
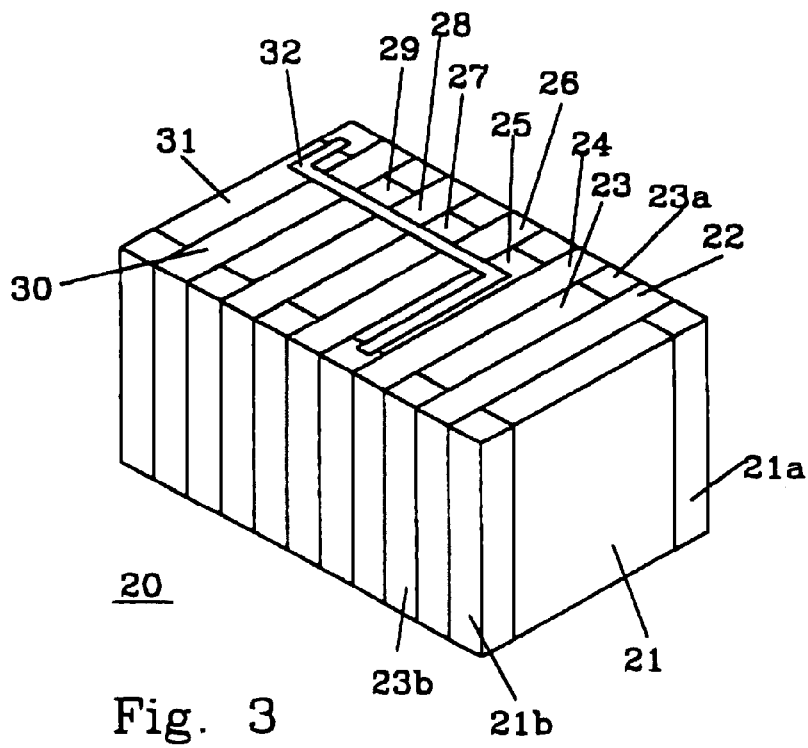
FIG. 3 shows a stacked array of passive components according to the present invention.

FIG. 3 shows an isometric view of a component module 20 according to the present invention. A stacked array of components 21, 23, 25, 27, 29 and 31 are stacked together, with adjacent components separated from each other by an insulating material. Components 21 and 23 are separated by insulator 22, components 23 and 25 are separated by insulator 24, components 25 and 27 are separated by insulator 26, components 27 and 29 are separated by insulator 28, and components 29 and 31 are separated by insulator 30.

The insulators between the components prevent electrical contact between the contacts of the components. For example, insulator 22 prevents contact 21a from electrically contacting contact 23a on one side of components 21 and 23, and prevents contact between contacts 21b and 23b on the other side of components 21 and 23. The insulators between the components also serve as a binder holding the components 21,23,25,27, 29 and 31 together in a single component array.

A conductor 32 may be formed on, but insulated from the components of the module, to interconnect two or more components in a module. By interconnecting the components on the module itself, shorter interconnection may be made and prevent conductor space problems on the printed wiring board.

Figure 4:
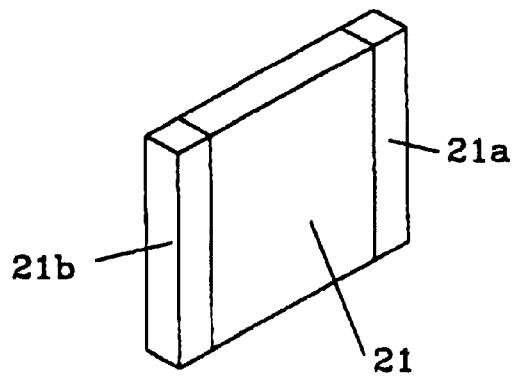
FIG. 4 shows an individual component of FIG. 3.

FIG. 4 shows a single component 21 having a contact 21a on one end and another contact 21b on another end. The contacts are shown extending along the length of the side on which it is placed. Components such as component 21 can be any one of resistors, capacitors, inductors and discrete semiconductor components such as transistors and diodes.

Figure 5:
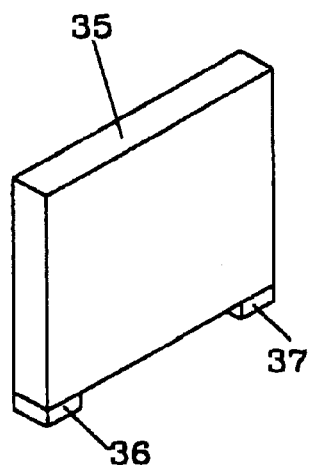
FIG. 5 shows a different embodiment of an individual component.

FIG. 5 shows a different embodiment of a discrete component 35 wherein the contacts 36 and 37 positioned at opposites corners of the same side of component 35. Contacts 36 and 37, when component 35 is mounted in a module on a printed wiring board, raise the module, and individual components, above the printed wiring board allowing better reflow of solder under the component module during a surface mount process.

Figure 6:
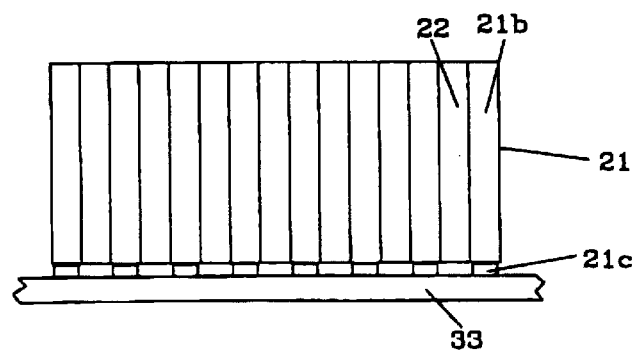
FIG. 6 is a side view of the stacked array of passive components mounted on a printed wiring board.

FIG. 6 is a side view of the component module 20 of FIG. 3 mounted on printed circuit board 33. As in FIGS. 3 and 4, each component has a contact extending along two opposite sides. Contact 21b of component 21 is electrically connected to printed wiring board conductor 21c. Similarly, the contact 21a is connected to another printed wiring board conductor 21d (see FIG. 7). In module form, components 21,23,25,27, 29 and 31 require less mounting area on the printed wiring board, and the conductors require less length when interconnecting the components with each other and to other devices on the printed circuit. Utilizing less space, more modules and devices can be mounted on the printed wiring board providing a compact assembly. Module 20, since it can be prewired, requires less assembly on the printed wiring board.

Figure 7:
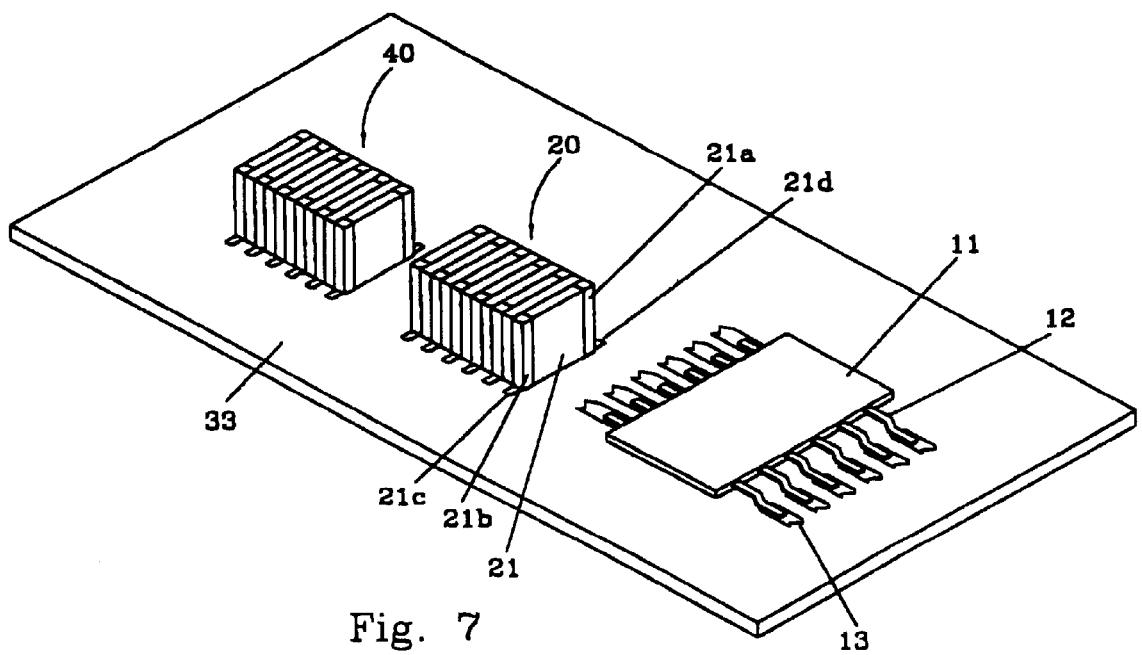
FIG. 7 shows a stacked array of passive components mounted on a printed wiring board along with an integrated circuit.

FIG. 7 shows component modules 20 of the present invention on a printed wiring board 33 with an integrated circuit 11. Each component in the module 20 is connected to printed wiring conductors. For example, component 21 has contacts 21a and 21b on opposite sides. Contact 21b is connected to conductor 21c, and contact 21a is connected to conductor 21d. With the components in module form, less space is required for all the components, and the conductors interconnecting the components are shorter and require less space, allowing for higher component density for on the printed wiring board. As illustrated in FIG. 7, a second component module 40 can be mounted on the printed wiring board 33 along with module 20 in a space less than the mounted prior art components of FIG. 1.

Figure 8:
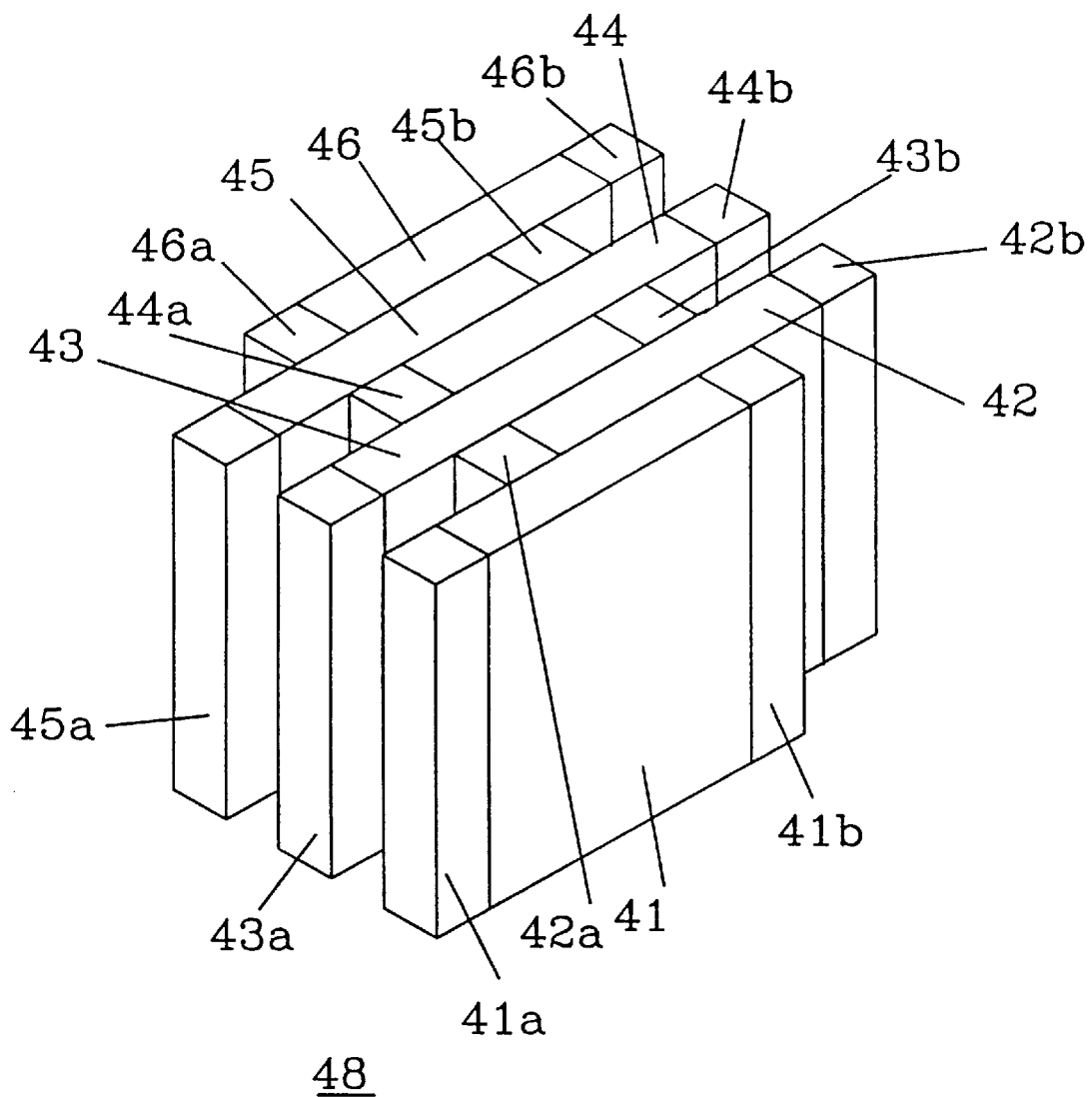
FIG. 8 shows a second embodiment of a stacked array of components.

FIG. 8 shows a stacked array 48 of components in which the components are offset or staggered with respect to each other. Component 42 with contacts 42a and 42b is offset with respect to component 41 with contacts 41a and 42b. Similarly, component 43 is offset with respect to both component 42 and component 44.

Each of the components 41, 42, 43, 44, 45 and 46 have two contact each as indicated, respectively, at 41a and 41b, 42a and 42b, 43a and 43b, 44a, and 44b, 45a and 45b, and 46a and 46b. The components are offset with respect to each other so that they may be stacked without insulating spaces.

The components are encapsulated with an insulating material such as a plastic or ceramic material so that a contact of an adjacent component may be stack against the body of an adjacent component without a spacer. This allows the stack of components to be smaller than the stack of components 20 of FIG. 5.

What is claimed:

1. A component module for combining a plurality of components into a single module for use with a printed wiring board, comprising:

a plurality of components;

a pair of contacts on each component;

a plurality of insulating spacers, one each between adjacent components, said spacers serving to insulate adjacent components from each other and to secure the components together to form the module;

wherein each component has electrical contacts along two sides of the component which extend to a third side for mounting to a printed wiring board conductor.

2. The module according to claim 1, wherein the module is encapsulated, including the components and insulating spacers.

3. The module according to claim 1, including interconnections on said module, insulated from the components, interconnecting at least two components in the module.

4. A component module for combining a plurality of components into a single module for use with a printed wiring board, comprising:

a plurality of components;

a pair of contacts on each component;

a plurality of insulating spacers, one each between adjacent components, said spacers serving to insulate adjacent components from each other and to secure the components together to form the module; and interconnection on module, insulated from the components, interconnecting at least two components in the module;

wherein each component has contacts along two sides of the component which extend to a printed wiring board conductor.

5. The module according to claim 4, wherein the module is encapsulated, including the components and insulating spacers.

6. A component module for combining a plurality of components into a single module for use with a printed wiring board, comprising:

a plurality of components; each component having electrical contacts extending respectively along the lengths of two opposite sides and configured for mounting at a third side to a printed wiring board conductor;

the components being bound together into a single component array in a configuration preventing electrical contact between adjacent corresponding component contacts.

7. The module of claim 6, further comprising:

a plurality of insulators;

the components being stacked together with the insulators placed between and separating adjacent components; and the insulators preventing electrical contact between adjacent corresponding component contacts and binding the components together into a single component array.

8. The module according to claim 7, further comprising a conductor formed across the array, to interconnect a contact of one of the opposite sides of a first of the stacked components to a contact of an opposite one of the sides of a second one of the stacked components.

9. The module of claim 6, wherein components are staggered to offset adjacent ones thereof, preventing electrical contact between adjacent corresponding component contacts; and the stacked components are encapsulated with an insulating material.

* * * * *